(12) United States Patent
Keeth et al.

(10) Patent No.: US 9,123,552 B2
(45) Date of Patent: Sep. 1, 2015

(54) APPARATUSES ENABLING CONCURRENT COMMUNICATION BETWEEN AN INTERFACE DIE AND A PLURALITY OF DICE STACKS, INTERLEAVED CONDUCTIVE PATHS IN STACKED DEVICES, AND METHODS FOR FORMING AND OPERATING THE SAME

(75) Inventors: Brent Keeth, Boise, ID (US); Christopher K. Morzano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1224 days.

(21) Appl. No.: 12/750,448

(22) Filed: Mar. 30, 2010

(65) Prior Publication Data

US 2011/0246746 A1 Oct. 6, 2011

(51) Int. Cl.
*G06F 13/14* (2006.01)
*H01L 25/065* (2006.01)
*G11C 5/02* (2006.01)
*G06F 13/38* (2006.01)
*H01L 23/31* (2006.01)
*H01L 23/48* (2006.01)
*H01L 25/18* (2006.01)

(52) U.S. Cl.
CPC .......... *H01L 25/0652* (2013.01); *G06F 13/385* (2013.01); *G11C 5/02* (2013.01); *H01L 23/3128* (2013.01); *H01L 23/481* (2013.01); *H01L 25/18* (2013.01); *H01L 2224/16145* (2013.01); *H01L 2225/06513* (2013.01); *H01L 2225/06544* (2013.01)

USPC .......................................................... 710/305
(58) Field of Classification Search
USPC .................. 710/305–309, 315–317; 257/678, 257/684–685, 701–703, 777
See application file for complete search history.

(56) References Cited

U.S. PATENT DOCUMENTS

| | | | |
|---|---|---|---|
| 5,347,428 A | 9/1994 | Carson et al. | |
| 5,432,729 A | 7/1995 | Carson et al. | |

(Continued)

FOREIGN PATENT DOCUMENTS

| | | | |
|---|---|---|---|
| CN | 1540665 A | 10/2004 | |
| CN | 102822966 A | 12/2012 | |

(Continued)

OTHER PUBLICATIONS

"Terrazon 3D Stacked Microcontroller with DRAM—FASTACK 3D Super-8051 Micro-controller", http://www.tezzaron.com/OtherICs/Super_8051.htm, (Link sent Oct. 2, 2007), 2 pgs.

(Continued)

*Primary Examiner* — Raymond Phan
(74) *Attorney, Agent, or Firm* — Schwegman Lundberg & Woessner, P.A.

(57) ABSTRACT

Various embodiments include apparatuses, stacked devices and methods of forming dice stacks on an interface die. In one such apparatus, a dice stack includes at least a first die and a second die, and conductive paths coupling the first die and the second die to the common control die. In some embodiments, the conductive paths may be arranged to connect with circuitry on alternating dice of the stack. In other embodiments, a plurality of dice stacks may be arranged on a single interface die, and some or all of the dice may have interleaving conductive paths.

43 Claims, 10 Drawing Sheets

(56) References Cited

U.S. PATENT DOCUMENTS

| | | | |
|---|---|---|---|
| 5,807,791 A | 9/1998 | Bertin et al. | |
| 5,815,427 A | 9/1998 | Cloud et al. | |
| 5,907,566 A | 5/1999 | Benson et al. | |
| 5,914,953 A | 6/1999 | Krause et al. | |
| 5,943,692 A | 8/1999 | Marberg et al. | |
| 5,973,392 A | 10/1999 | Senba et al. | |
| 6,046,945 A | 4/2000 | Su et al. | |
| 6,047,002 A | 4/2000 | Hartmann et al. | |
| 6,081,463 A | 6/2000 | Shaffer et al. | |
| 6,154,851 A | 11/2000 | Sher et al. | |
| 6,201,733 B1 | 3/2001 | Hiraki et al. | |
| 6,407,283 B2 | 6/2002 | Couves | |
| 6,438,029 B2 | 8/2002 | Hiraki et al. | |
| 6,582,992 B2 * | 6/2003 | Poo et al. | 438/109 |
| 6,661,712 B2 | 12/2003 | Hiraki et al. | |
| 6,754,117 B2 | 6/2004 | Jeddeloh | |
| 6,778,404 B1 | 8/2004 | Bolken et al. | |
| 6,791,832 B2 | 9/2004 | Budny | |
| 6,897,096 B2 * | 5/2005 | Cobbley et al. | 438/123 |
| 7,009,872 B2 | 3/2006 | Alva | |
| 7,124,200 B2 | 10/2006 | Sato et al. | |
| 7,200,021 B2 | 4/2007 | Raghuram | |
| 7,257,129 B2 | 8/2007 | Lee et al. | |
| 7,279,795 B2 | 10/2007 | Periaman et al. | |
| 7,317,256 B2 | 1/2008 | Williams et al. | |
| 7,477,545 B2 | 1/2009 | Tu et al. | |
| 7,496,719 B2 | 2/2009 | Peterson et al. | |
| 7,526,597 B2 | 4/2009 | Perego et al. | |
| 7,623,365 B2 | 11/2009 | Jeddeloh | |
| 7,701,252 B1 | 4/2010 | Chow et al. | |
| 7,715,255 B2 | 5/2010 | Tu et al. | |
| 7,855,931 B2 * | 12/2010 | LaBerge et al. | 365/230.03 |
| 7,964,916 B2 | 6/2011 | Or-Bach et al. | |
| 7,978,721 B2 | 7/2011 | Jeddeloh et al. | |
| 8,060,774 B2 | 11/2011 | Smith et al. | |
| 8,063,491 B2 * | 11/2011 | Hargan | 257/777 |
| 8,065,550 B2 | 11/2011 | Kim et al. | |
| 8,120,958 B2 * | 2/2012 | Bilger et al. | 365/185.11 |
| 8,127,204 B2 * | 2/2012 | Hargan | 714/766 |
| 8,139,430 B2 | 3/2012 | Buchmann et al. | |
| 8,233,303 B2 * | 7/2012 | Best et al. | 365/51 |
| 8,281,074 B2 * | 10/2012 | Jeddeloh | 711/122 |
| 8,294,159 B2 | 10/2012 | Or-Bach et al. | |
| 8,476,735 B2 * | 7/2013 | Hsu et al. | 257/528 |
| 8,806,131 B2 | 8/2014 | Jeddeloh et al. | |
| 2002/0191475 A1 | 12/2002 | Lee et al. | |
| 2003/0197281 A1 | 10/2003 | Farnworth et al. | |
| 2004/0164412 A1 | 8/2004 | Bolken et al. | |
| 2004/0250046 A1 | 12/2004 | Gonzalez et al. | |
| 2004/0257847 A1 | 12/2004 | Matsui et al. | |
| 2005/0081012 A1 | 4/2005 | Gillingham et al. | |
| 2005/0162897 A1 | 7/2005 | Alva | |
| 2005/0189639 A1 | 9/2005 | Tanie et al. | |
| 2006/0036827 A1 | 2/2006 | Dell et al. | |
| 2006/0055020 A1 | 3/2006 | Bolken et al. | |
| 2006/0126369 A1 | 6/2006 | Raghuram | |
| 2007/0045780 A1 | 3/2007 | Akram et al. | |
| 2007/0058410 A1 | 3/2007 | Rajan | |
| 2007/0067826 A1 | 3/2007 | Conti | |
| 2007/0070669 A1 | 3/2007 | Tsern | |
| 2007/0075734 A1 | 4/2007 | Ramos et al. | |
| 2007/0132085 A1 | 6/2007 | Shibata et al. | |
| 2007/0220207 A1 | 9/2007 | Black et al. | |
| 2007/0290315 A1 | 12/2007 | Emma et al. | |
| 2008/0077853 A1 | 3/2008 | Kriegesmann | |
| 2008/0201548 A1 | 8/2008 | Przybylski et al. | |
| 2009/0059641 A1 | 3/2009 | Jeddeloh | |
| 2009/0210600 A1 | 8/2009 | Jeddeloh | |
| 2009/0319703 A1 | 12/2009 | Chung | |
| 2010/0005238 A1 | 1/2010 | Jeddeloh et al. | |
| 2010/0070696 A1 | 3/2010 | Blankenship | |
| 2010/0078829 A1 * | 4/2010 | Hargan | 257/777 |
| 2010/0121994 A1 | 5/2010 | Kim et al. | |
| 2010/0191999 A1 | 7/2010 | Jeddeloh | |
| 2010/0211745 A1 | 8/2010 | Jeddeloh | |
| 2011/0090004 A1 * | 4/2011 | Schuetz | 327/564 |
| 2011/0148469 A1 * | 6/2011 | Ito et al. | 327/77 |
| 2011/0264858 A1 | 10/2011 | Jeddeloh et al. | |
| 2015/0091189 A1 | 4/2015 | Keeth et al. | |

FOREIGN PATENT DOCUMENTS

| | | |
|---|---|---|
| CN | 101946245 B | 1/2014 |
| CN | 103761204 A | 4/2014 |
| EP | 0606653 A1 | 7/1994 |
| JP | 61196565 A | 8/1986 |
| JP | 6251172 A | 9/1994 |
| JP | 11194954 A | 7/1999 |
| JP | 2002259322 A | 9/2002 |
| JP | 2004327474 A | 11/2004 |
| JP | 2005004895 A | 6/2005 |
| JP | 2005244143 A | 9/2005 |
| JP | 2007129699 A | 5/2007 |
| JP | 2007140948 A | 6/2007 |
| TW | 358907 | 5/1999 |
| TW | I282557 B | 6/2007 |
| TW | I299499 B | 8/2008 |
| TW | 201220374 A | 5/2012 |
| WO | WO-2007095080 A2 | 8/2007 |
| WO | WO-2008076790 A2 | 6/2008 |
| WO | WO-2009105204 A2 | 8/2009 |
| WO | WO-2009105204 A3 | 8/2009 |
| WO | WO-2010051461 A1 | 5/2010 |
| WO | WO-2011126893 A2 | 10/2011 |
| WO | WO-2011126893 A3 | 10/2011 |

OTHER PUBLICATIONS

"Terrazon 3D Stacked DRAM Bi-Star Overview", http://www.tezzaron.com/memory/Overview_3D_DRAM.htm, (Link sent Oct. 2, 2007), 1 pg.

"Terrazon FaStack Memory—3 D Memory Devices", http://www.tezzaron.com/memory/Overview_3D_DRAM.htm, (Link sent Oct. 2, 2007 Downloaded Oct. 27, 2007), 3 pgs.

Gann, Keith D, "Neo-stacking technology", *Irvine Sensors Corporation News Release*, (Mar. 2007), 4 pgs.

"Chinese Application Serial No. 200980105675.X, Office Action mailed Jun. 18, 2013", w/English Translation, 5 pgs.

"Chinese Application Serial No. 200980105675.X, Office Action mailed Aug. 27, 2012", w/English Translation, 17 pgs.

"Chinese Application Serial No. 200980105675.X, Response filed Mar. 4, 2013 to Office Action mailed Aug. 27, 2012", w/English Claims, 11 pgs.

"Chinese Application Serial No. 200980105675.X, Response filed Aug. 28, 2013 to Office Action mailed Jun. 18, 2013", w/English Claims, 11 pgs.

"Chinese Application Serial No. 200980148407.6, Office Action mailed Jun. 11, 2014", w/English Translation, 4 pgs.

"Chinese Application Serial No. 200980148407.6, Office Action mailed Jul. 29, 2013", w/English Claims, 12 pgs.

"Chinese Application Serial No. 200980148407.6, Response filed Feb. 12, 2014 to Office Action mailed Jul. 29, 2013", w/English Claims, 11 pgs.

"European Application Serial No. 09712316.0, Office Action mailed Feb. 22, 2013", 5 pgs.

"European Application Serial No. 09712316.0, Response filed Aug. 22, 2013 to Office Action mailed Feb. 22, 2013", 10 pgs.

"European Application Serial No. 09712316.0, Response filed Feb. 13, 2012 to Search Report mailed Aug. 2, 2011", 8 pgs.

"European Application Serial No. 09824176.3, Extended European Search Report mailed Feb. 26, 2013", 4 pgs.

"European Application Serial No. 11766502.6, Extended European Search Report mailed Oct. 11, 2013", 5 pgs.

"European Application Serial No. 11766502.6, Office Action mailed Oct. 29, 2013", 1 pg.

"European Application Serial No. 11766502.6, Response filed May 7, 2014 to Office Action mailed Oct. 29, 2013", 10 pgs.

"European Application Serial No. 09712316.0, Office Action mailed Aug. 2, 2011", 5 pgs.

(56) References Cited

OTHER PUBLICATIONS

"International Application Serial No. PCT/US2009/001017, International Preliminary Report on Patentability mailed Sep. 2, 2010", 7 pgs.

"International Application Serial No. PCT/US2011/030544, International Preliminary Report on Patentability mailed Oct. 11, 2012", 7 pgs.

"International Application Serial No. PCT/US2011/030544, Search Report mailed Dec. 7, 2011", 3 pgs.

"International Application Serial No. PCT/US2011/030544, Written Opinion mailed Dec. 7, 2011", 5 pgs.

"Japanese Application Serial No. 2010-546799, Office Action mailed Mar. 11, 2014", w/English Translation, 6 pgs.

"Japanese Application Serial No. 2010-546799, Office Action mailed Jul. 30, 2013", w/English Translation, 11 pgs.

"Japanese Application Serial No. 2010-546799, Response filed May 22, 2014", w/English Claims, 12 pgs.

"Japanese Application Serial No. 2010-546799, Response filed Oct. 23, 2013 to Office Action mailed Jul. 30, 2013", w/English Claims, 14 pgs.

"Japanese Application Serial No. 2011-534814, Office Action mailed Dec. 24, 2013", w/English Translation, 9 pgs.

"Japanese Application Serial No. 2011-534814, Response filed Mar. 24, 2014 to Office Action mailed Dec. 24, 2013", w/English Claims, 14 pgs.

"Taiwan Application Serial No. 098104986, Final Office Action mailed Mar. 28, 2013", w/English Claims, 8 pgs.

"Taiwan Application Serial No. 098104986, Office Action mailed Sep. 5, 2012", w/English Translation, 34 pgs.

"Taiwan Application Serial No. 098104986, Re-exam Brief filed Sep. 27, 2013", w/English Claims, 27 pgs.

"Taiwan Application Serial No. 098104986, Response filed Dec. 1, 2012 to Office Action mailed Sep. 5, 2012", w/English Translation, 12 pgs.

"Chinese Application Serial No. 200980148407.6, Office Action mailed Dec. 22, 2014", 6 pgs.

"Chinese Application Serial No. 200980148407.6, Response filed Aug. 22, 2014 to Office Action mailed Jun. 11, 2014", 11 pgs.

"Chinese Application Serial No. 201180017420.5, Office Action mailed Jan. 5, 2015", 11 pgs.

"Korean Application Serial No. 10-2011-7012151 Response filed Jan. 26, 2015 to Office Action mailed Nov. 25, 2014", With the English claims, 34 pgs.

"Taiwanese Application Serial No. 098137010 Response filed Jan. 30, 2015 to Office Action mailed Dec. 17, 2014", With the English claims, 10 pgs.

* cited by examiner

APPARATUSES ENABLING CONCURRENT COMMUNICATION BETWEEN AN INTERFACE DIE AND A PLURALITY OF DICE STACKS, INTERLEAVED CONDUCTIVE PATHS IN STACKED DEVICES, AND METHODS FOR FORMING AND OPERATING THE SAME

BACKGROUND

Computers and other electronic products, e.g., televisions, digital cameras, and cellular phones, often use memory devices to store data and other information. In order to increase the amount of memory provided in a limited space, some memory devices may have multiple semiconductor dice arranged in a stack (e.g., a vertical arrangement).

DETAILED DESCRIPTION

Figure 1:
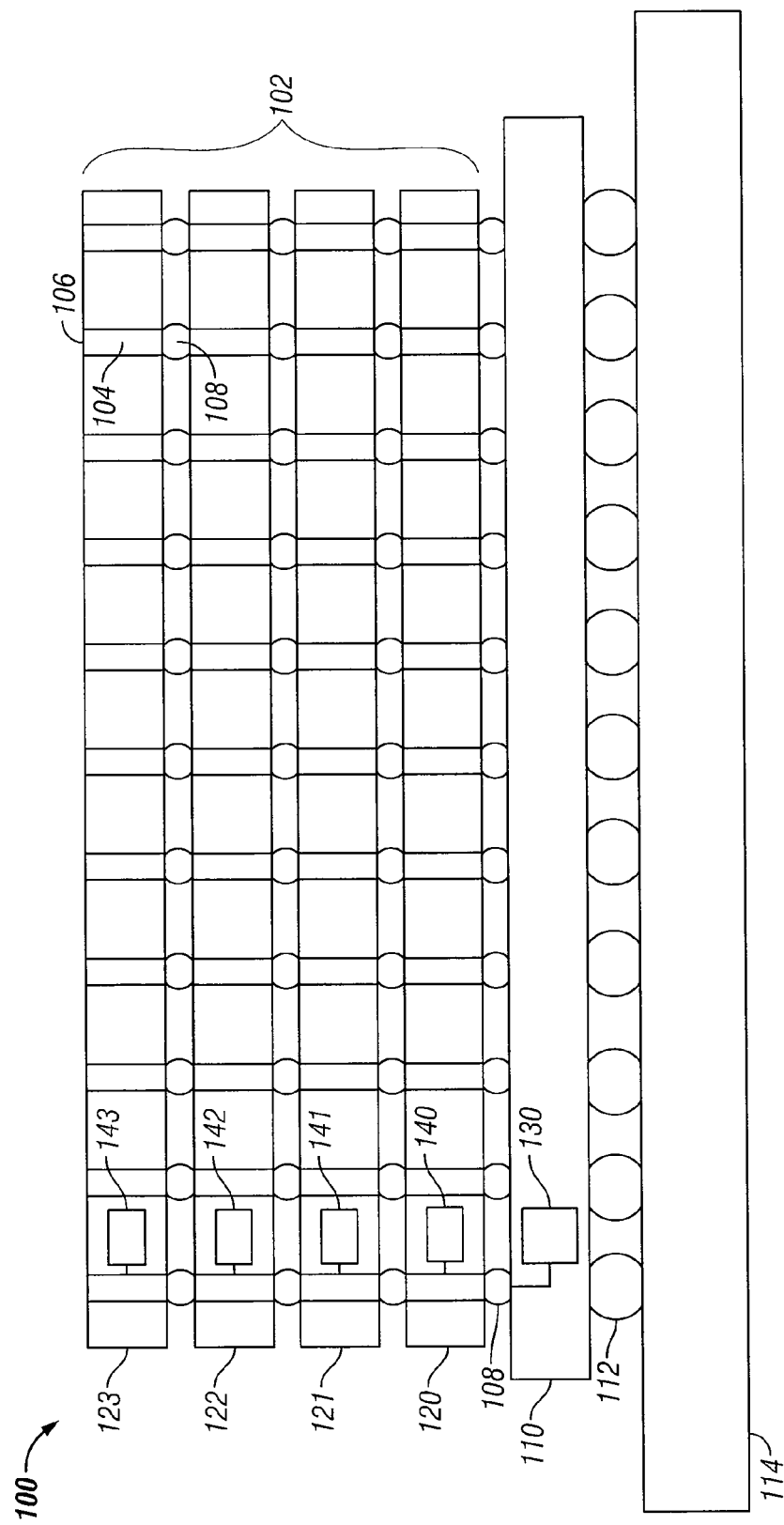
FIG. 1 illustrates a block diagram of an apparatus including a dice stack which includes dice physically arranged in the stack according to an example embodiment.

In many embodiments, dice may be arranged in a stack on an interface die and in some embodiments, a plurality of dice stacks may be arranged on a common (e.g., shared) interface die. For example, a stack of memory dice may be connected to an interface die to provide input/output functionality with other components. Electrical connection through a memory die substrate may be provided by conductive vias that penetrate the substrate, such as from one surface of a memory die substrate to another surface. When silicon technology is used, these vias may be referred to as through silicon vias (TSV).

In many embodiments, each memory die in a dice stack may be divided into a plurality of partitions, and several partitions (e.g., partitions in substantial vertical alignment in the stack) may be connected to a control circuit of the interface die and to each other by one or more electrically conductive paths, such as for example, TSVs. Partitions vertically aligned across multiple dice in the stack, together with the corresponding control circuit and electrical connections may constitute a "vault", described below. The partitions of a vault may share address and command control connections (e.g., TSVs) and input/output data pins among other connections, and each partition may have a different chip select line to prevent data contention.

Generally, reduction in the area size of each die improves yield during manufacturing. Using smaller dice in a dice stack may involve the concomitant use of redundant circuitry for each dice stack at the dedicated interface die. Multiple dice stacks (e.g., parallel stacking of dynamic random access memory (DRAM) devices) using smaller dice may be placed on a single, common interface die to achieve the same bandwidth as a single stack on a single interface die with the same or substantially same memory.

In some embodiments, concurrently communicating with multiple partitions of a vault requires a greater number of connections and dedicated circuitry at each die and at corresponding control circuits of the interface die. The dedicated circuitry at every die for each partition may utilize an increase in die size so that bandwidth may be maintained. Reducing the die size may reduce the bandwidth and may require use of additional interface dice dedicated to each resulting smaller dice stack to produce the same bandwidth as a larger dice stack on a single interface die. By interleaving the conductive paths to connect with a logic circuit on every other die in the stack (e.g., via partition interleaving), die space may be reduced and bandwidth can be maintained in many embodiments.

Various embodiments of the invention will thus be described with reference to the accompanying figures. In many embodiments, an apparatus arranged in a dice stack is described. In an example embodiment, the device may comprise a stacked memory device such as a hybrid buffered dynamic random access memory (HBDRAM) a DRAM, double-data-rate three synchronous dynamic random access memory (DDR3-SDRAM), or the like. In many embodiments, interleaving connections (e.g., TSVs) permits a reduction in die size. Alternating connecting conductive paths to I/O logic circuitry along partitions of a vault can reduce dedicated circuitry and die space required for additional circuitry on the die. Furthermore, concurrent partition interleaving may produce a reduction in the number of unique partitions on each HBDRAM DRAM layer, while maintaining bandwidth performance.

In some embodiments, with interleaving connectivity at every other die, the architecture may realize a doubling of bandwidth between the interface die and the memory dice stack. In other embodiments, combining a smaller die size to increase yield at manufacturing and placing multiple stacks with interleaving TSVs in parallel (e.g., parallel DRAM stacking) on a single interface die may improve bandwidth for the device. In some other embodiments, concurrent partition interleaving and parallel DRAM stacking may be combined to improve the dice yield, along with dice stack performance, and maintain bandwidth.

FIG. 1 illustrates a block diagram of an apparatus 100 including dice stack 102 which includes dice 120, 121, 122, and 123 physically arranged in the stack 102 (e.g., forming a stacked memory device) according to an example embodiment. Stack 102 may form a memory device in which dice 120 through 123 are coupled to and communicate with each other and to an interface die 110 by one or more conductive paths 106, in accordance with an embodiment of the invention. In the stack 102, the conductive paths 106 may include vias 104 and joints 108. As depicted, conductive paths 106 may extend at least partly through each die and some conductive paths 106 may extend the entire height of stack 102. The conductive paths 106 may communicate (e.g., transfer) information such as data, address, control, ID information, among other information.

One or more joints 112 may connect the interface die 110 to a package substrate 114. In an embodiment, apparatus 100 may be communicatively coupled with external devices, e.g., processors and memory controllers, through the interface die, e.g., die 110, and apparatus 100 may be included in electronic devices, e.g., a computer, a television, a digital camera, a cellular phone. FIG. 1 shows conductive paths 106 with a specific number of paths and stack 102 with a specific number of dice 120 through 123 as an example. The number of conductive paths 106 and dice 120 through 123 in stack 102 may vary.

As shown in FIG. 1, each of the dice 120, 121, 122, and 123 includes a corresponding logic circuit 140, 141, 142, and 143, respectively, and interface die 110 includes a control circuit 130. Logic circuits 140 through 143 and control circuit 130 include logic circuitry and other components to control communication to and from dice 120, 121, 122, and 123. In an embodiment, the control circuit 130 of interface die 110 may detect the presence of individual dice and may be configured to assign ID information during initialization of the stack 102. The control circuit 130 may operate to retain the assigned ID information after the initialization of stack 102, such as in order for control circuit 130 to reference each die 120 through 123 by the ID information. In some embodiments, logic circuits 140 through 143 may retain other information (e.g., data) alternatively or in addition to ID information. In other embodiments, more than one logic circuit 140-143 may be connected to the conductive path at each die.

For clarity, FIG. 1 omits the logic and circuit elements of logic circuits 140, 141, 142, and 143. It should be noted that these elements may include transistors, select elements and other circuit elements with functions that are configured to facilitate various function for each die.

Figure 2:
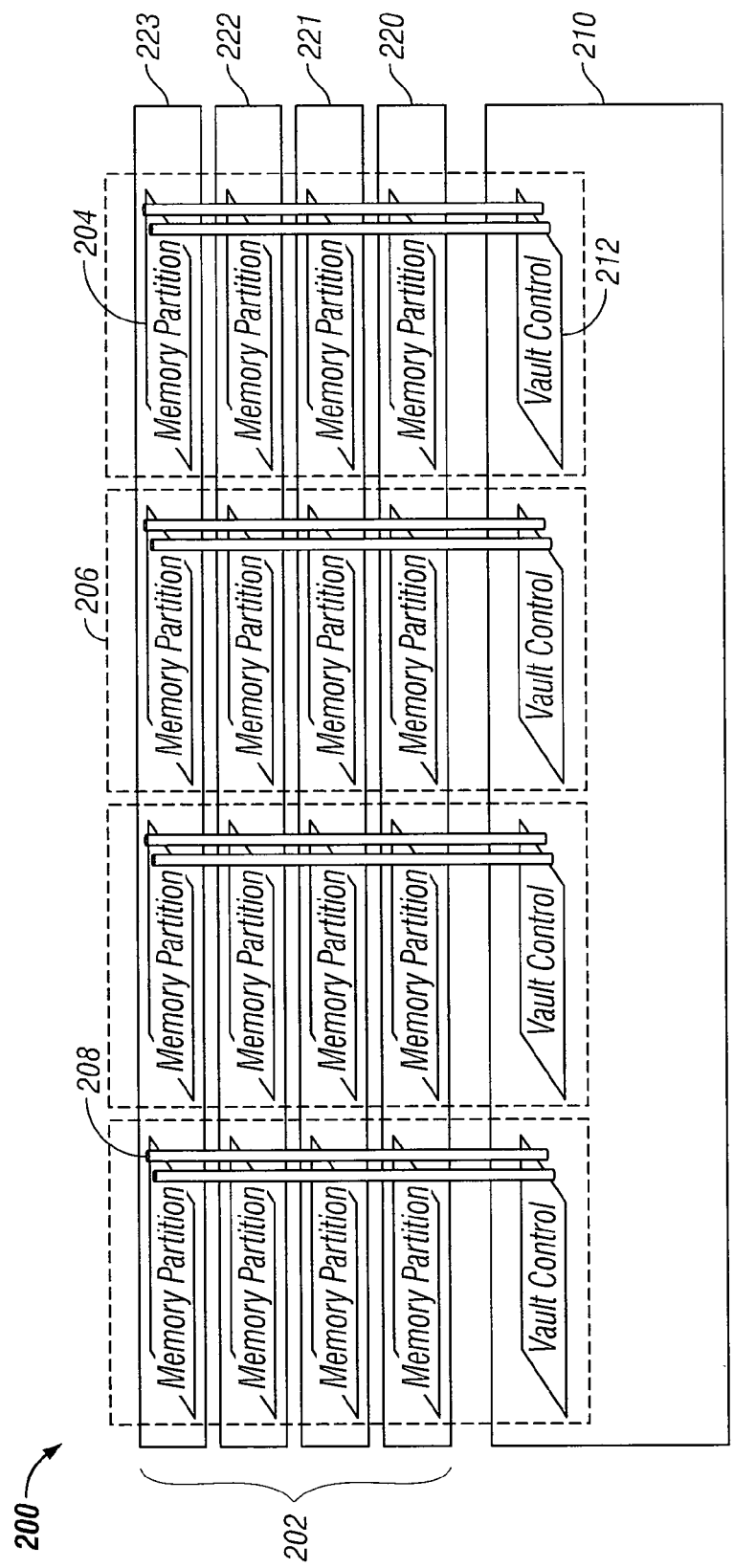
FIG. 2 illustrates a schematic diagram of a cross sectional view of an apparatus including a stack of dice according to an example embodiment.

FIG. 2 illustrates a schematic diagram of a cross sectional view of an apparatus 200 including stack 202 of dice 220 through 223 according to an example embodiment. Each die 220 through 223 may comprise a plurality of memory partitions 204 and interface die 210 may comprise control circuits 212 to enable communication and control with the corresponding memory partition 204 stacked above the respective control circuit via communicative paths 208. The partitions 204, corresponding control circuit 212, and communication paths 208 together comprise a memory vault 206. One or more memory vaults 206 may be included in apparatus 200.

Apparatus 200 may form a memory device having circuit components such as memory cells, decode circuits, control circuits, and other components. Each memory partition 204 may include a plurality of memory cells. Apparatus 200 may include circuitry in addition to the memory partitions 204 and vault control circuits 212; these additional components are omitted from FIG. 2 so as not to obscure the embodiments described herein. Interface die 210 may include additional circuitry, e.g., buffers, and I/O drivers, to accommodate the transfer of information at appropriate data transfer rates between the apparatus 200 and another device, such as processors or a memory controller in communication with the stack 202 by way of the interface die 210. The apparatus 200 may also form part of an integrated circuit (IC) chip, such as when dice 220 through 223 are fabricated as part of an IC chip.

In some example embodiments, the communication paths 208 may interleave between the memory partitions in a vault. For example, a first communication path in a vault may be connected to circuitry (e.g., input/output circuitry) of all odd partitions in the memory vault and pass through the even vaults without connecting to circuitry. A second communication path may connect to circuitry (e.g., input/output circuit) on the even partitions in the same vault and pass through the odd partitions without connecting to circuitry. By interleaving the connections, a vault control circuit may concurrently communicate with (e.g., access and send data to) multiple partitions in the vault and thereby improve bandwidth.

Figure 3:
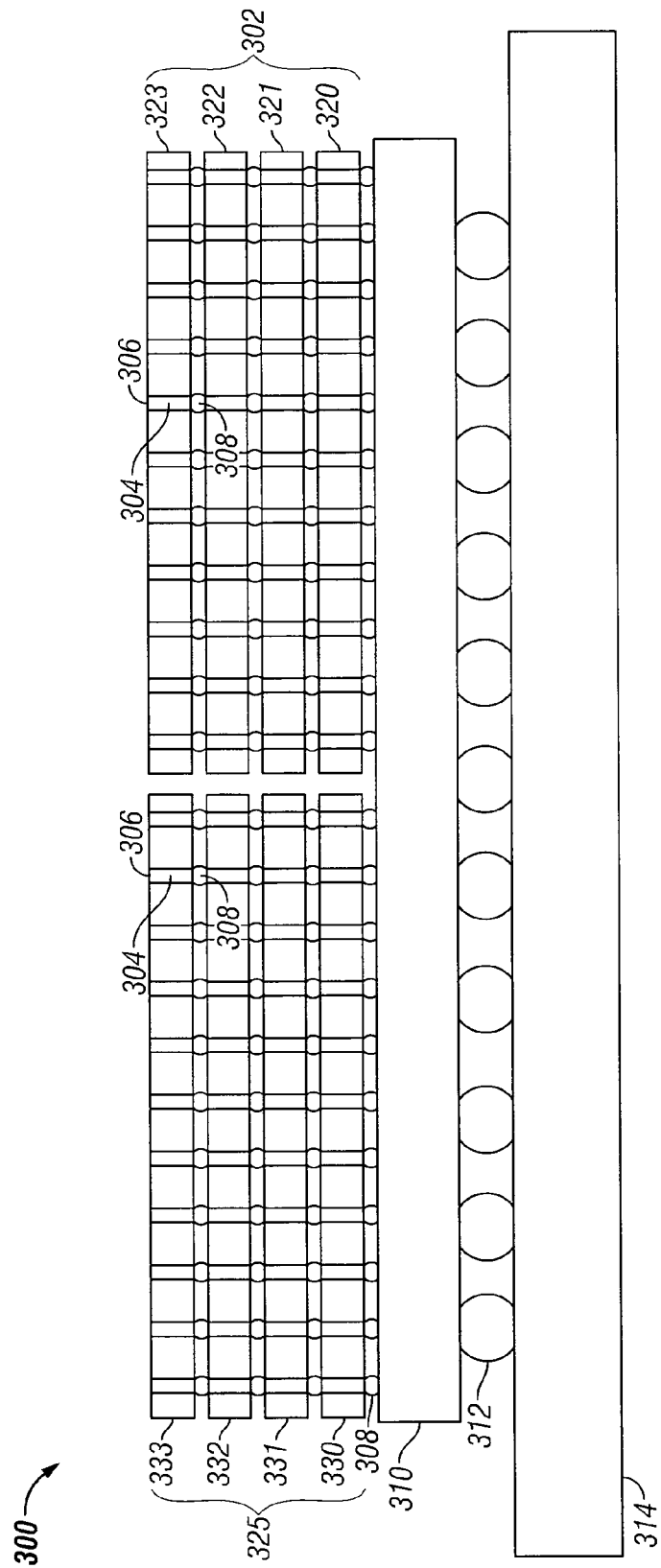
FIG. 3 illustrates a cross-sectional view of an example apparatus with a first dice stack in a first position on an interface die and a second stack at a second position on the interface die, in accordance with an example embodiment.

FIG. 3 illustrates a cross-sectional view of an example apparatus 300 with a first dice stack 302 in a first position on an interface die 310 and a second stack 325 at a second position on the interface die 310, in accordance with an example embodiment. Apparatus 300 includes two dice stacks 302 and 325 sharing single interface die 310 unlike the single dice stack 102 of apparatus 100 in FIG. 1. Each dice stack 302 and 325 may be constructed similarly to the dice stack of apparatus 100, where each dice in the stacks 302 and 325 has an area approximately half the size of the dice in stack 102, thus permitting two dice stacks on an interface die having approximately the same area as the interface die 110 of FIG. 1. The first dice stack 302 includes dice 320, 321, 322, and 323 vertically arranged and connected to the interface die 310 by conductive paths 306 at a first position. The second dice stack 325 includes dice 330, 331, 332, and 333 also arranged vertically and connected to the interface die 310 at a second position using conductive paths 306. As mentioned above and similar to FIG. 1, the conductive paths 306 may comprise a combination of TSVs 304 and joints 308. The conductive paths 306 may include a combination of vias 304 and joints 308, and at least some of the conductive paths 306 may entirely pass through or partially pass through the dice stack 302.

As mentioned above, in comparison to dice stack 102 of FIG. 1, one or more dice in dice stack 302 and 325 may be about half the area size of a die in dice stack 102. The bandwidth of each dice stack 302 and 325 individually may be reduced in proportion to the size of the dice. For example, if dice stacks 302 and 325 are each half the area size of the dice stack 102 of FIG. 1, the bandwidth of each die may also be halved owing to the halving of the number of vaults. With smaller dice in apparatus 302, a higher dice yield may result during manufacturing. With the interface die 310 of FIG. 3 supporting both first dice stack 302 and second dice stack 325 simultaneously, full bandwidth of the apparatus 300 may be maintained in some embodiments through parallel operation. In some embodiments, the first dice stack 302 and second dice stack may be different sizes. In one embodiment, the first dice stack 302 may be capable of a greater memory capacity than dice stack 325 or vice versa. As will be evident with the discussion surrounding FIG. 4, more than two dice stacks may share an interface die.

Parallel stacking as illustrated in FIG. 3 may reduce the number of partitions in a dice stack. In example embodiments, full bandwidth may be realized by placing parallel stacks on a single interface die. For example, placing two stacks of two gigabyte, eight partition DRAMs or four stacks of one gigabyte, four partition DRAMs on a single interface die may achieve substantially the same bandwidth as a single stack of DRAM having four gigabytes and 16 partitions, while increasing the manufacturing yield attributed to a smaller DRAM die size.

Figure 4:
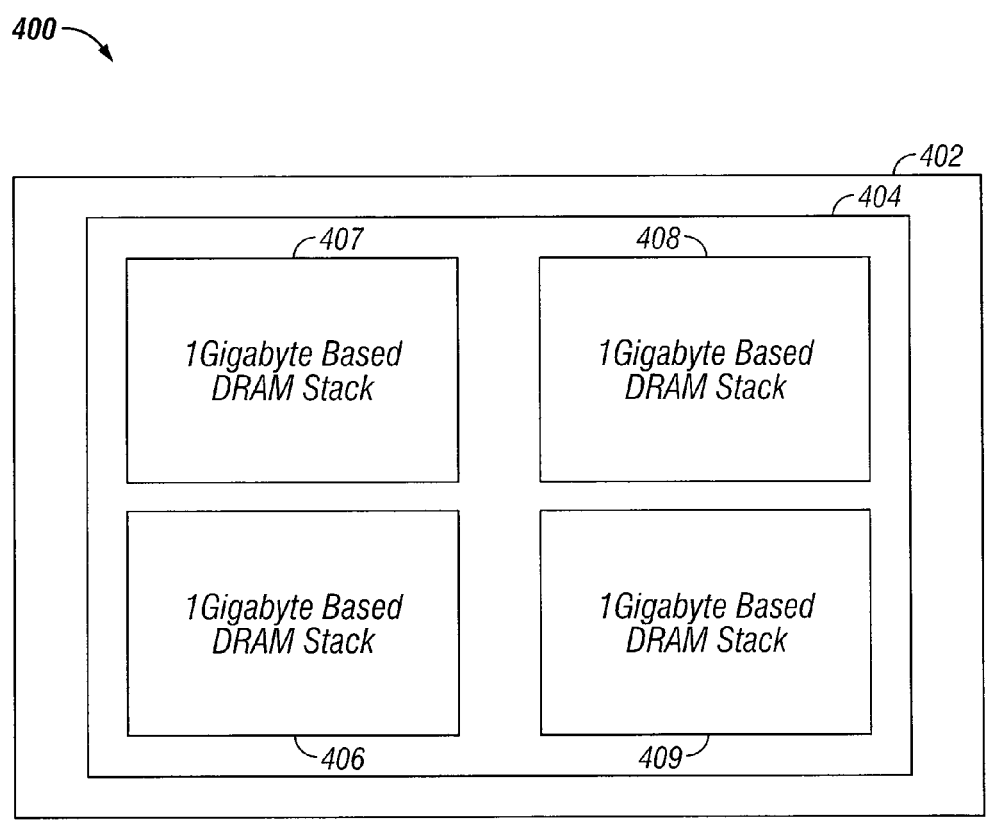
FIG. 4 illustrates a planar view of an apparatus including four dice stacks sharing one interface die according to an example embodiment.

FIG. 4 illustrates a planar view of an apparatus 400 including four dice stacks 406, 407, 408, 409 sharing one interface die 404 according to an example embodiment. Each of the dice stacks 406, 407, 408, and 409 may comprise one gigabyte of DRAM-based memory stacks. With four dice stacks 406, 407, 408, and 409 on one interface die 404, the interface die 404 may support the full bandwidth of the device through concurrent communication with all four dice stacks 406 through 409. In this embodiment, the apparatus 400 may have the same memory capacity as one-four gigabyte stack, with parallel operation of all four stacks at the interface die 404 to maintain the same or similar bandwidth as the singular four gigabyte stack. In some embodiments, greater or fewer number of dice stacks may be arranged on a shared interface die 404 having approximately the same surface area. For example, two-two gigabyte stacks may be positioned on one interface die similar in area to interface die 404 to provide approximately the same amount of memory with generally the same amount of bandwidth as the embodiment shown in FIG. 4.

Figure 5:
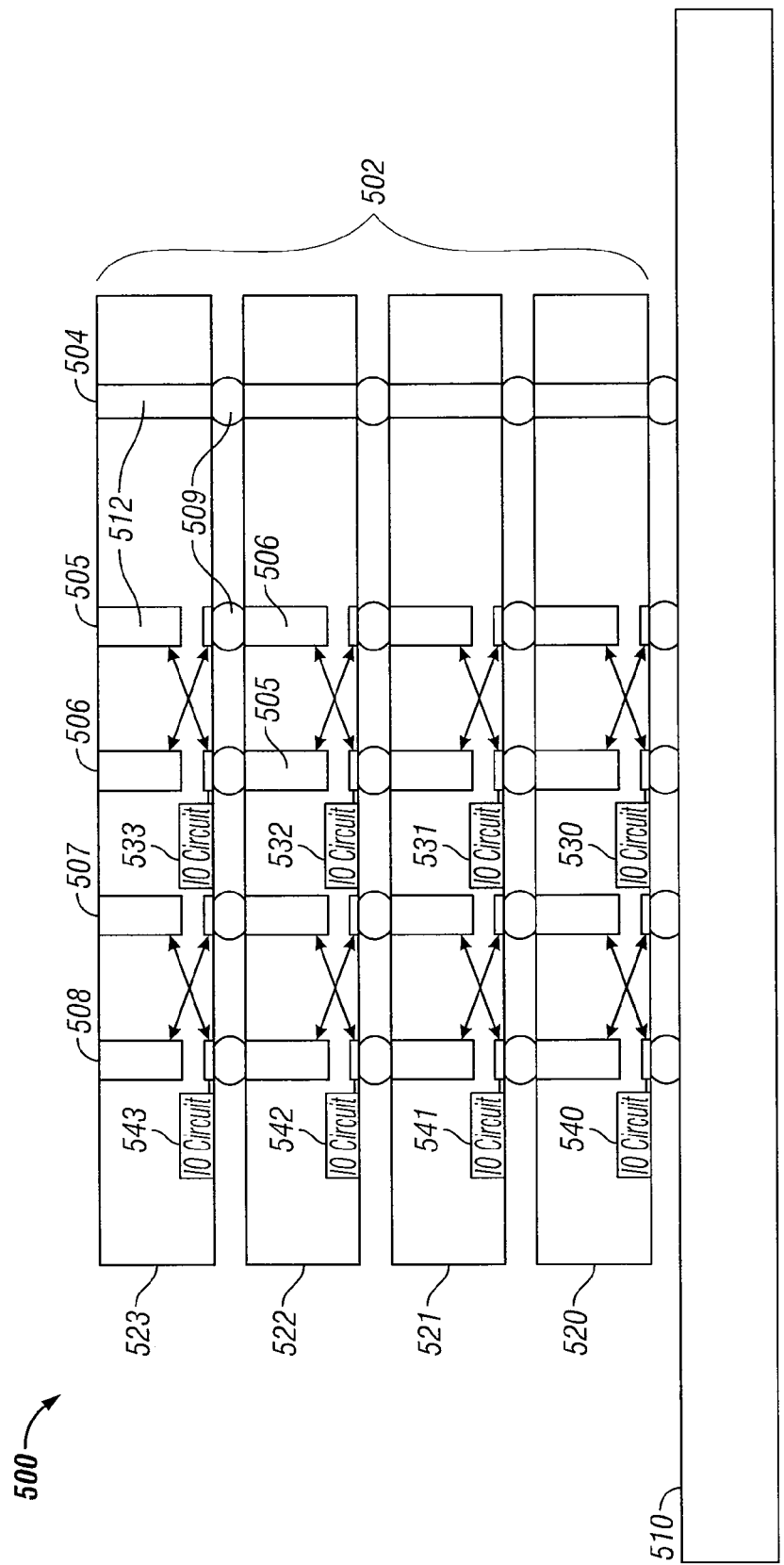
FIG. 5 illustrates a cross-sectional view of an apparatus incorporating concurrent partition interleaving of conductive paths in a dice stack in an example embodiment.

FIG. 5 illustrates a cross sectional view of an apparatus 500 incorporating partition interleaving of conductive paths in a dice stack 502 in an example embodiment. In the example, dice stack 502 includes four dice 520, 521, 522, and 523 with one non-interleaving conductive path 504 and two interleaving pairs of conductive paths, the first pair 505 and 506, and a second pair 507 and 508. In an example embodiment, the non-interleaving conductive path 504 may be connected to the command and/or addresses circuits of each dice 520 through 524 and a command and/or addressing circuit of the interface die 510. Similar to previous examples, the conductive paths 504, 505, 506, 507, and 508 may include TSVs and joints 509 and the conductive paths 504 through 508 may entirely pass through or partially pass through the dice stack 502.

In the example, both pairs of conductive paths 505, 506, 507, and 508 may be connected to the input/output circuits of dice in the stack 502. For example, as shown in FIG. 5 of the first pair of interleaving conductive paths 505 and 506, conductive path 505 may connect with the input/output circuit 530 of the first die 520 in the stack 502, and may pass through the second die 521 without connecting to any circuitry in the die 520. The conductive path 505 may connect to the input/output circuit 532 of the third die 522 and again pass through the last die 523 in stack 502.

Similarly, conductive path 506 may connect with the input/output circuit 531 of the second die 521 in the stack 502, and may pass through the first die 520 without connecting to any circuitry. The conductive path 506 may connect to the input/output circuit 533 of the fourth die 523 and again pass through the third die 522 in stack 502. The arrows illustrate communicative paths crossing over at each die 520 through 523 that may be implemented using conventional metal and via layers available within the DRAM. The conductive paths may be interleaved, each connecting with circuitry on alternating dice in the stack. Similar to the first pair of interleaving conductive paths 505 and 506, the second pair of interleaving paths 507 and 508 has substantially identical connections with I/O circuits 540, 541, 542, and 543 on alternating dice.

By interleaving the conductive paths in the dice stack 502, the interface die 510 may access each die (or a partition of each die) independently of the die above or below, and the interface die 510 may concurrently access dice 520 through 523, thereby increasing bandwidth. For example, apparatus 500 may access both I/O circuits 540 and 541 of dice 520 and 521 concurrently from the interface die 510 to reduce the possibility of queuing data, and perhaps resulting in increasing bandwidth. Similarly, in some embodiments, the command circuits and/or address circuits of each dice 520 through 523 may be connected to and utilize the interleaving conductive paths 505 through 508 in order to communicate command and/or address signals between the interface die and dice 520 through 523 which may perhaps increase bandwidth and reduce queuing of signals.

Alternating dice in the stack 502 may be part of separate vaults. For example, the first and third dice 520 and 522 along with respective I/O circuits and the conductive path 505 and 507 may be a part of a first vault while second and fourth dice 521 and 523 along with respective I/O circuits and conductive paths 506 and 508 may be part of a second vault. In the example, this construction allows the interface die 510 to concurrently access the first and second vaults and concurrently drive data to partitions within the vaults. In an embodiment, with input/output circuitry connected to the interface die via interleaving conductive paths and command and/or address circuitry of the dice connected to the interface die via interleaving conductive paths, each vault may be independently controlled. Although the above described configuration may provide concurrent operation of the first and second vaults, it is understood that signals and information (e.g., data) between these vaults may be staggered (e.g., offset in time) such that first and second vaults may not consistently operate concurrently.

Figure 6A:
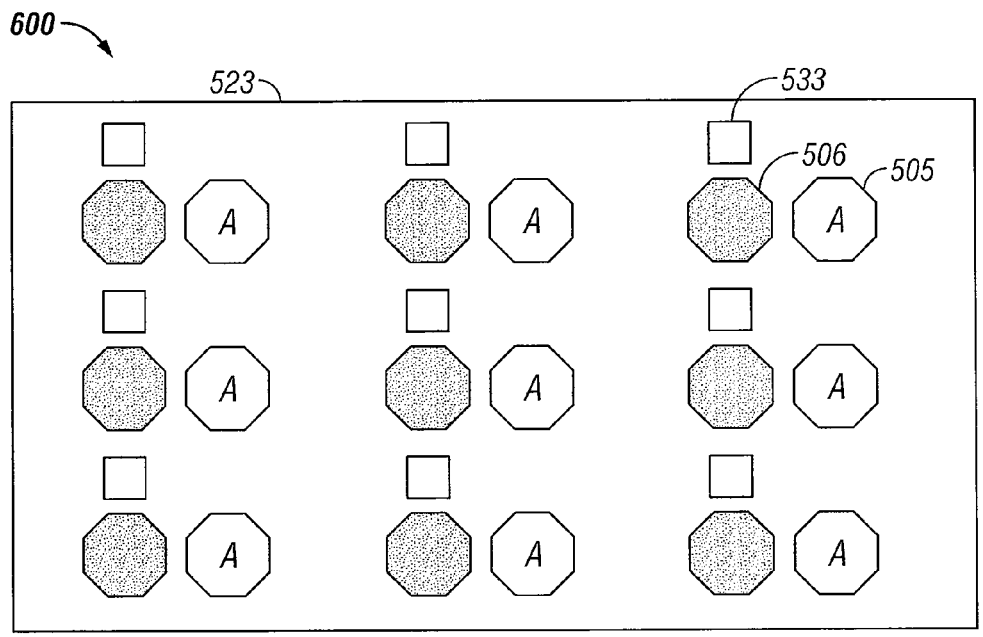
FIG. 6A and FIG. 6B respectively illustrate a planar view of two adjacent dice in the dice stack of FIG. 5 with concurrent partition interleaving of the conductive paths.
Figure 6B:
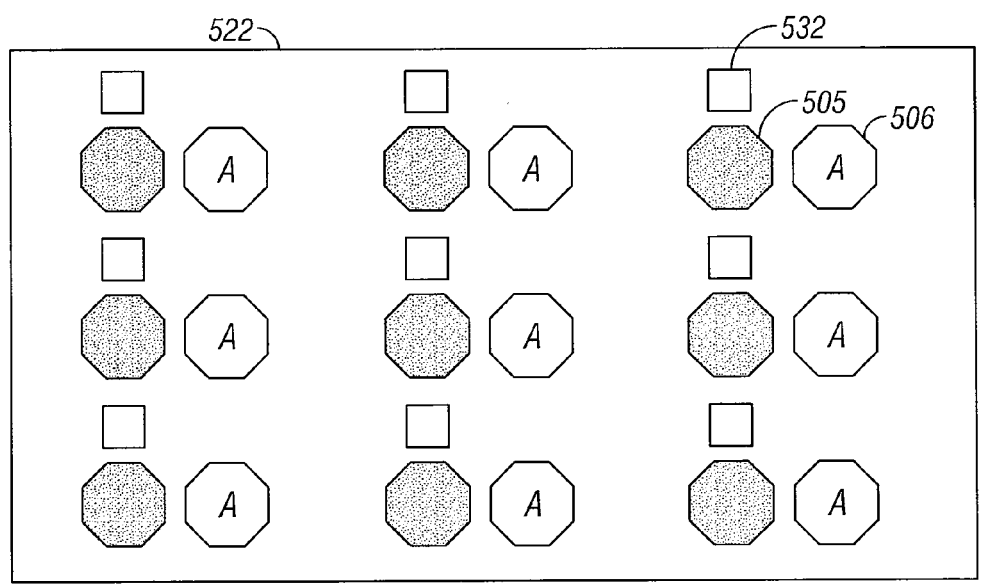

FIG. 6A and FIG. 6B respectively illustrate a planar view 600 of two adjacent dice 523 and 522 of the stack depicted in FIG. 5 with concurrent partition interleaving of the conductive paths 505 and 506. In an example embodiment, as depicted in FIG. 6A the first die 523 (e.g., top die) includes TSV 505 which may be connected to circuitry 533. Conductive paths 506 may be pass through TSVs of the first die 523, which do not connect to circuitry on the first die 523, and may be connected to circuitry 532 on the adjacent die 522 as illustrated in FIG. 6B. In an embodiment, the area of each die 523 and 522 may be slightly larger than dice of a stack without pass through TSVs.

As mentioned above, the added pass through TSVs permit concurrent communication with (e.g., signaling to) multiple partitions within a vault. Adjacent dice may be positioned such that a pass through TSV of a first die is aligned with a non-pass through TSV on the next die through die rotation and/or die flipping. The circumferential dimensions of the conductive path of the TSV may be determined by circuitry 533 and 532 on dice 523 and 522. Adding the pass through TSVs to each dice stack may increase the dimensional area of each die to slightly greater than the area of a die without pass through TSVs.

Figure 7:
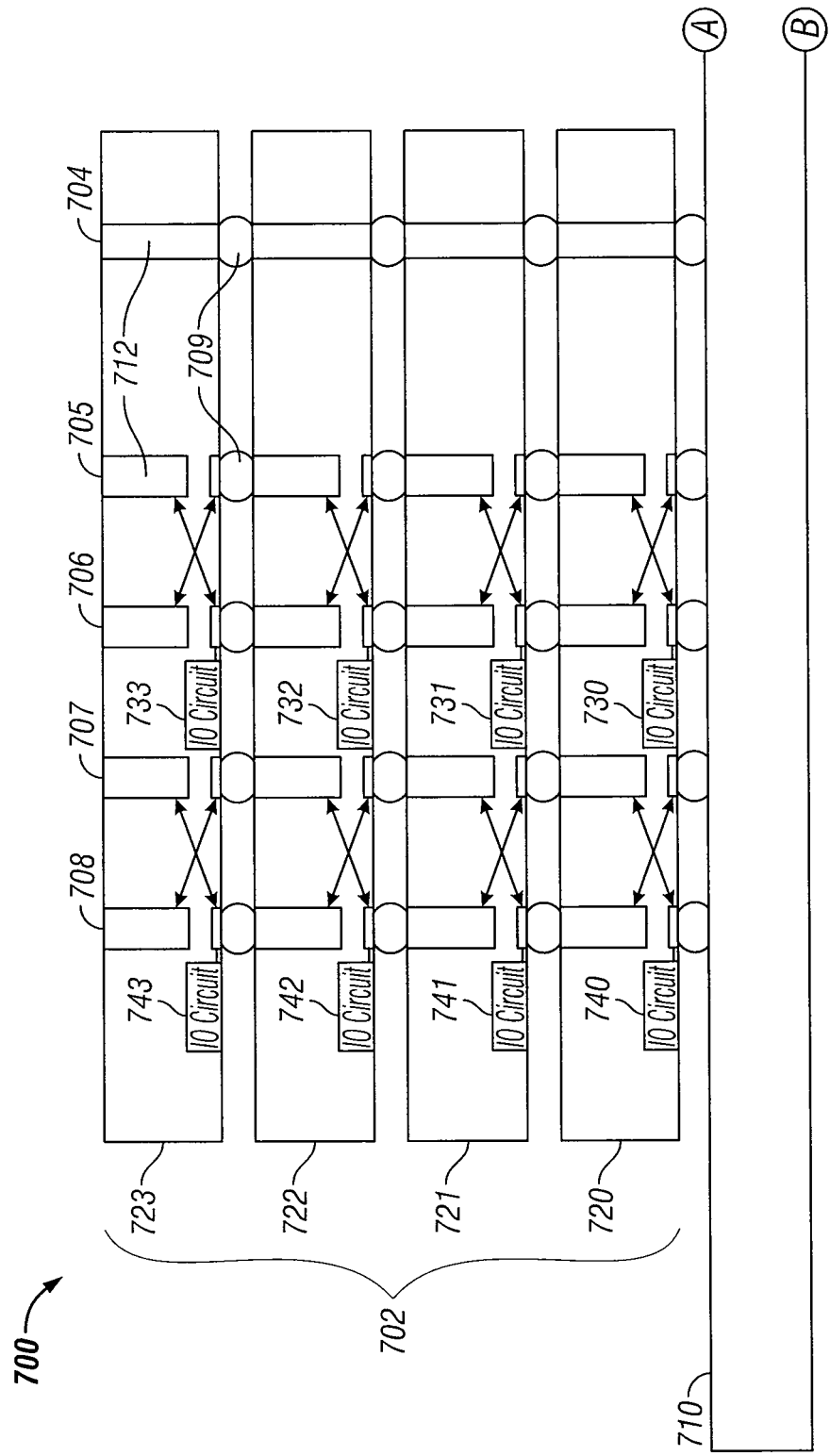
FIG. 7 illustrates a cross-sectional view of an apparatus incorporating parallel dice stacking of a first dice stack and a second dice stack both including conductive paths with concurrent partition interleaving, placed on a single, common interface die.
Figure 7:
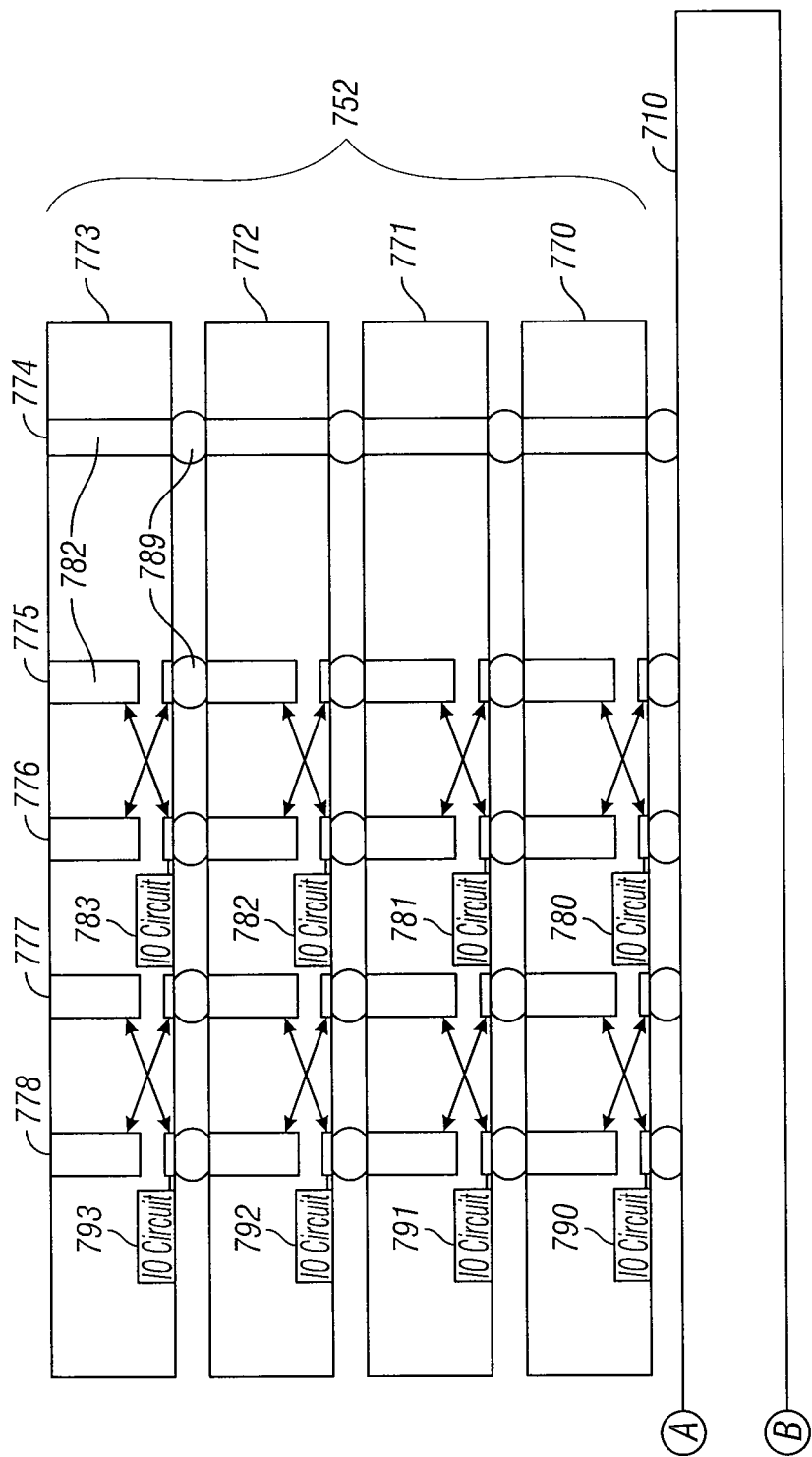

FIG. 7 illustrates a cross-sectional view of an apparatus 700 incorporating parallel dice stacking of a first dice stack 702 and a second dice stack 752 both including conductive paths with partition interleaving, placed on a single, common interface die 710. As with previous examples, the interface die 710 may include circuitry to communicate with (e.g., access and address) the two dice stacks 702, 752 in parallel. Furthermore, the interface die 710 may include circuitry (e.g., control circuitry) to concurrently access multiple partitions within a vault of a dice stack.

In an example, the first dice stack 702 includes dice 720, 721, 722, and 723 and the second dice stack 752 includes dice 770, 771, 772, and 773. As depicted in FIG. 7, each dice stack 702 and 752 may include more than one pair of interleaving conductive paths. Each conductive path may be connected to a control circuit at the interface die 710 and may provide control and data to partitions on alternating dice within a vault.

First and second dice stacks 702 and 752 each may include one or more pairs of interleaving conductive paths (only two pairs are shown in the figure for clarity). Dice stack 702 includes a first pair of interleaving conductive paths comprising a first conductive path 705 interleaving with a second conductive path 706, and a second pair of interleaving conductive paths comprising a third conductive path 707 and a fourth conductive path 708. First and third conductive paths 705 and 707 may connect with I/O circuitry on even dice 721 and 723 and pass through the odd dice 720 and 722. Conductive path 705 may connect with I/O circuits 733 and 731 while conductive path 707 may connect with I/O circuits 741 and 743. Second and fourth conductive paths 706 and 708 may pass through even dice 721 and 723 and may connect with circuitry at the odd dice 720 and 722. Conductive path 706 may connect with I/O circuits 730 and 732 while conductive path 708 may connect with I/O circuits 740 and 742.

Similar to the first stack 702, the second stack 752 is shown to include two pairs of interleaving conductive paths. A third pair of conductive paths includes a fifth conductive path 775 interleaving with a sixth conductive path 776, and a fourth pair of conductive paths includes a seventh conductive path 777 interleaving with an eighth conductive path 778.

Fifth and seventh conductive paths 775 and 777 may connect with I/O circuitry on even dice 771 and 773 and pass through the odd dice 770 and 772. Fifth conductive path 775 may connect with I/O circuits 781 and 783 while seventh conductive path 777 may connect with I/O circuits 791 and 793. Sixth and eighth conductive paths 776 and 778 may pass through even dice 771 and 773 and may connect with circuitry at the odd dice 770 and 772. Conductive path 776 may connect with I/O circuits 780 and 782 while conductive path 778 may connect with I/O circuits 790 and 792.

As mentioned above, with the reference to the conductive paths of FIGS. 1, 3, and 5, conductive paths 704, 705, 706, 707, and 708 of the first dice stack 702 include joints 709 and TSVs 712, at least some of which extend entirely through the dice stack 702 and some of which connect with circuitry. Similarly, conductive paths 774, 775, 776, 777, and 778 of the second dice stack 752 include joints 789 and TSVs 782, at least some of which travel entirely through the dice stack 752 to the interface die 710.

Fewer or greater dice stacks may be positioned on and share use of the interface die 710. In an example, when combining parallel stacking with concurrent partition interleaving, four stacks may share a single interface die 710 of one gigabyte, two partition DRAM stacks and may realize approximately 128 gigabits per second bandwidth.

Figure 8:
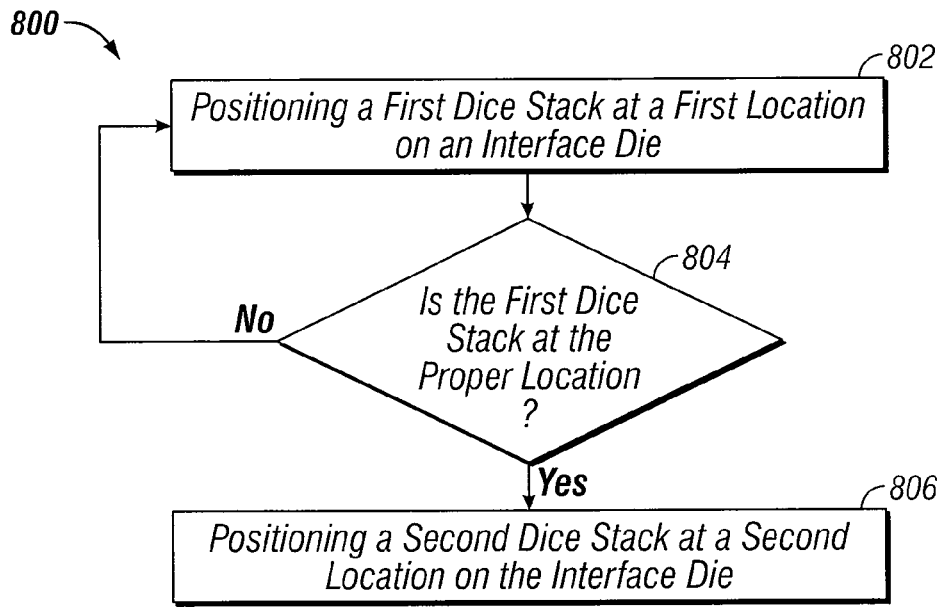
FIG. 8 is a flowchart showing a method of positioning dice stack on a common interface die.

FIG. 8 is a flowchart showing a method 800 of positioning dice stack on a common interface die. Method 800 may be used in apparatus and devices similar or identical to apparatus 100, 200, 300, and 400 described above with reference to FIG. 1 through FIG. 4. Thus the components of apparatus and devices used in method 800 may include the components of apparatus 100, 200, 300, and 400 described with reference to FIG. 1 through FIG. 4 above respectively, among others.

Block 802 of method 800 operates to position a first dice stack at a first position on an interface die. At decision block 804, the method 800 determines whether the first dice stack is at the proper position. If so, then at block 806 the method 800 operates to position a second dice stack at a second position on the interface die. If the first dice stack is not in the proper position, then from decision block 804, the method 800 returns to block 802 to position the first dice stack. In some embodiments, method 800 may place more than two dice stacks on an interface die. For example, the method 800 may include four dice stacks, while in other embodiments, fewer or greater number of dice stacks may be placed on the common interface die. In some embodiments, the stacks may include interleaved conductive paths that enable concurrent communication between each dice stack and the interface die, and in some embodiments, the interleaved conductive paths may enable concurrent communication with one or more memory partitions in a memory vault of the same stack or across a plurality of different stacks. Method 800 may include other activities similar or identical to the activities of positioning dice stacks on a common interface die as described with reference to FIG. 1 through FIG. 8 above.

Figure 9:
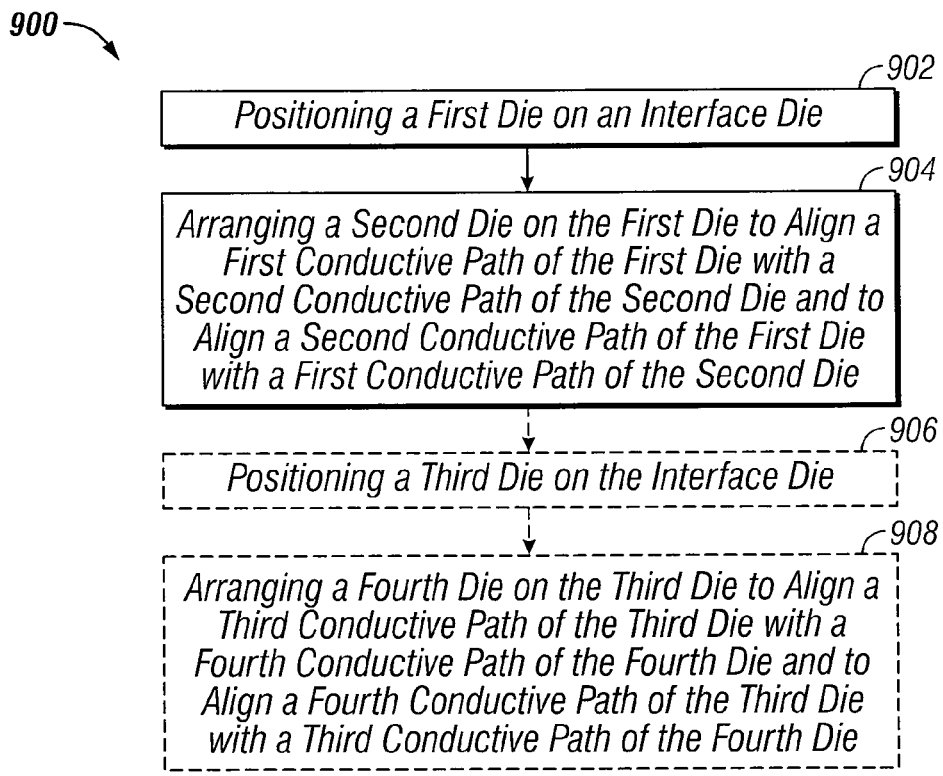
FIG. 9 is a flowchart showing a method of arranging dice in a stack according to an embodiment of the invention.

FIG. 9 is a flowchart showing a method 900 of arranging dice in a stack according to an embodiment of the invention. Method 900 may be used in apparatus and device similar or identical to apparatus 500, 600 and 700 described above with reference to FIGS. 5, 6, and 7. Thus, the components of apparatus and devices used in method 900 may include components of apparatus 500, 600 and 700 described with reference to FIG. 5 through FIG. 7 above respectively, among others.

At block 902, the method 900 operates to position a first die on an interface die. The first die may include a plurality of conductive paths and circuitry while the interface die may include one or more control circuits. At block 904, the method 900 operates to arrange a second die on the first die to align a first conductive path of the first die with a second conductive path of the second die and to align a second conductive path of the first die with a first conductive path of the second die. In some embodiments, the conductive paths may be coupled to circuitry on alternating dice in a dice stack. Method 900 may include other activities similar or identical to the activities of communicating (e.g., transferring) control information and IDs as described above with reference to FIG. 5 through FIG. 7. In some embodiments, method 900 may additionally arrange a plurality of the dice stacks on a common (e.g., single, shared) interface die. As indicated by the dashed lines around blocks 906 and 908, the method 900 may optionally position a second dice stack on the interface die. At block 906 method 900 positions a third die on the interface die. At block 908, the method 900 may arrange a fourth die on the third die to align a third conductive path of the third die with a fourth conductive path of the fourth die and to align a fourth conductive path of the third die with a third conductive path of the fourth die. These dice stacks may be similar to the dice stacks resulting from the steps of method 800.

Figure 10:
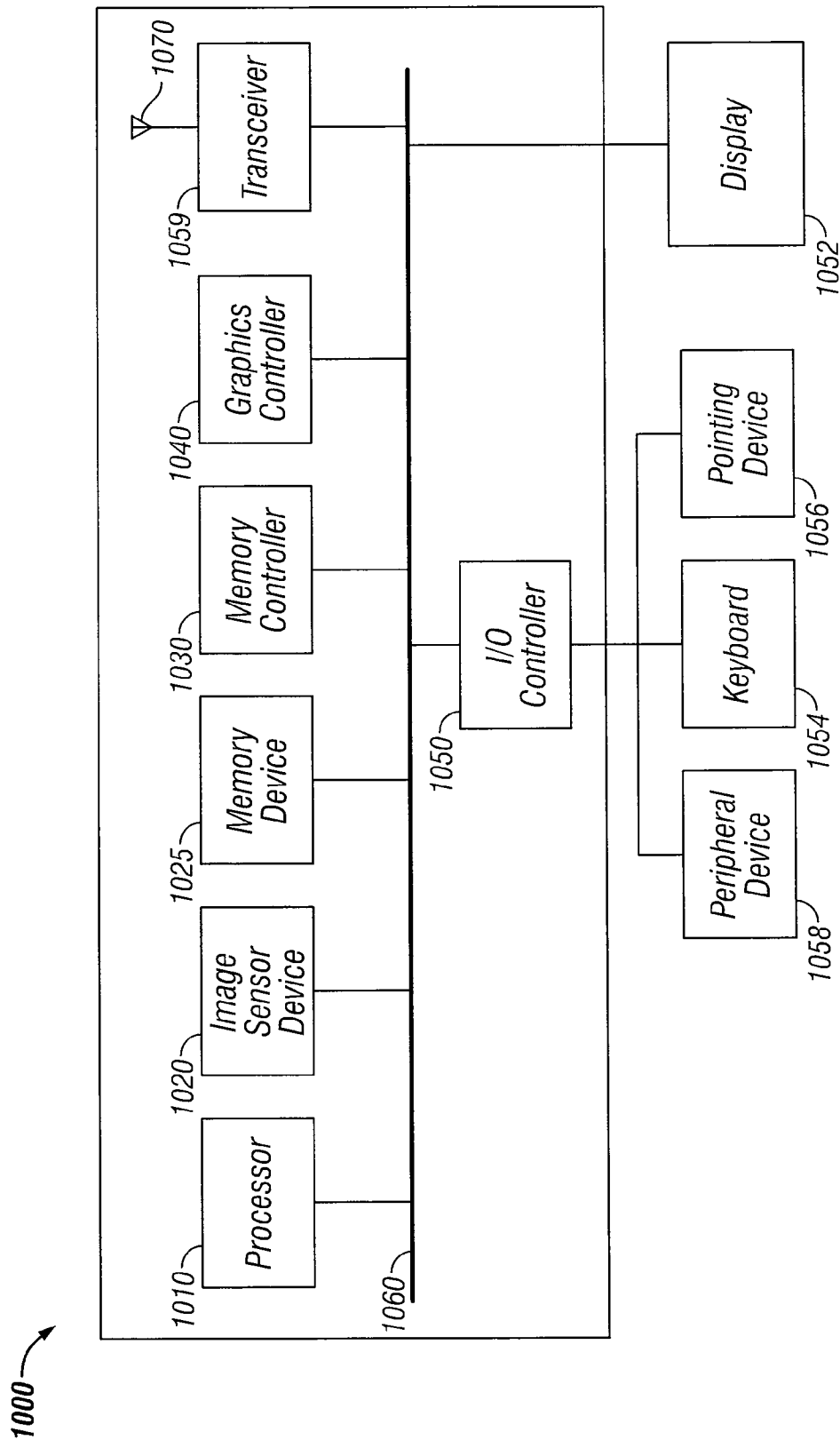
FIG. 10 illustrates a system utilizing the apparatus illustrated in FIG. 1, through FIG. 7 and operations according to one or more of the activities included in methods of FIGS. 8 and 9 according to an example embodiment.

FIG. 10 illustrates a system 1000 utilizing the apparatus 100, 200, 300, 400, 500, 600 and 700, illustrated in FIG. 1, through FIG. 7 and operations according to one or more of the activities included in methods 800 and 900 of FIGS. 8 and 9 according to an example embodiment. System 1000 may include one or more of any of the following elements: a processor 1010, memory device 1025, an image sensor device 1020, a memory controller 1030, a graphics controller 1040, an input and output (I/O) controller 1050, a display 1052, a keyboard 1054, a pointing device 1056, a peripheral device 1050, and/or a system transceiver 1059. System 1000 may also include a bus 1060 to transfer information among the components of system 1000 and provide power to at least some of these components. The system 1000 may comprise one or more circuit boards 1002 where some of the components of the system 1000 may be attached, and an antenna 1070 to wirelessly transmit and receive information to and from system 1000. System transceiver 1059 may operate to transfer information from one or more of the components of system 1000 (e.g., at least one of processor 1010 and memory device 1025) to antenna 1070. System transceiver 1059 may also operate to transfer information received at antenna 1070 to at least one of the processor 1010 and at least one of memory device 1025. The information received at antenna 1070 may be transmitted to system 1000 by a source external to system 1000.

Processor 1010 may include a general-purpose processor or an application specific integrated circuit (ASIC). Processor 1010 may include a single core processor or a multiple-core processor. Processor 1010 may execute one or more programming commands to process information. The information may include digital output information provided by other components of system 1000, such as provided by image sensor device 1020 or memory device 1025.

Memory device 1025 may include a volatile memory device, a non-volatile memory device, or a combination of both. For example, memory device 1025 may include a dynamic random access memory (DRAM) device, a static random access memory (SRAM) device, a flash memory device, a phase change memory device, or a combination of these memory devices. Memory device 1025 may include one or more of the various embodiments described herein, such as one or more of any one or more of the apparatus 100, 200, 300, 400, 500, 600 and 700, described above with reference to FIG. 1 through FIG. 7.

Image sensor device 1020 may include a complementary metal-oxide-semiconductor (CMOS) image sensor having a CMOS pixel array or charge-coupled device (CCD) image sensor with a CCD pixel array.

Display 1052 may include an analog display or a digital display. Display 1052 may receive information from other components. For example, display 1052 may receive information that is processed by one or more of image sensor device 1020, memory device 1025, graphics controller 1040, and processor 1010 to display information such as text or images.

The illustrations of apparatus (e.g., apparatus 100, 200, 300, 400, 500, 600 and 700) and systems (e.g., system 1000) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 100, 200, 300, 400, 500, 600 and 700) and systems (e.g., system 1000) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., 100, 200, 300, 400, 500, 600, and 700) and systems (e.g., system 1000), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, similar to or identical to the system 1000, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods having dice arranged in a stack. The dice may include at least a first die and a second die. The stack may include conductive paths coupled to the dice. The conductive paths may be configured to concurrently access one or more memory partitions. Other embodiments including additional apparatus and methods are described above with reference to FIG. 1 through FIG. 9.

Embodiments may include more than two interleaving conductive paths. For example, a dice stack may include a four-way configuration of interleaving conductive paths, in which each conductive path may connect circuitry of the interface die to circuitry of every fourth die in the stack and pass through the other dice. In an example, a dice stack may include an interface die and four dice. A first conductive path may connect circuitry of the interface die with circuitry of the first die in the stack and pass through the remaining dice; a second conductive path may connect circuitry of the interface die with circuitry of a second die in the stack and pass through the remaining dice, a third conductive path may connect circuitry of the interface die with circuitry of a third die in the stack and pass through the remaining dice, and a fourth conductive path may connect with circuitry of a fourth die in the stack and pass through the remaining dice. In an example, the four-way interleaving configuration may produce four interleaved vaults.

In some embodiments of a four-way interleaving conductive path configuration, each of the conductive paths may connect to every other die in the stack (e.g., all even dice) and pass through the other dice (e.g., all odd dice). In an example dice stack with an interface die including four dice, and with four-way interleaving conductive paths, a first and third conductive path may connect circuitry of the interface die with circuitry of the first and third dice in the stack while passing through the second and fourth dice, and the second and fourth conductive paths may connect circuitry of the interface die with circuitry of the second and fourth dice while passing through the first and third dice. In various other embodiments, three conductive paths may be interleaved whereby a first conductive path may connect circuitry of the interface die to circuitry of a first die and may pass through the other dice in the stack, a second conductive path may connect circuitry of the interface die to a second die in the stack and pass through the other dice in the stack, and a third conductive path may connect circuitry of the interface die to a third die in the stack and pass through the other dice in the stack. Various other configurations may include combinations of fewer or greater number of dice in the stack and a fewer or greater number of interleaving conductive paths connecting various circuitry of dice with the circuitry of the interface die and passing through other dice to permit concurrent communication with dice in the stack.

Selective structuring of connective paths in a stack of dice may thus be useful, perhaps serving to enable efficient accounting of the number of dice in a particular structure, such as one or more stacks of dice, or an IC chip, to increase the operational speed of elements in the stack(s), and to reduce the amount of space occupied by a given number of devices, or to increase an amount of memory that occupies a given portion of real estate. Reduced production costs to achieve a given level of performance may result.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, various embodiments of the invention are determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   a plurality of dice stacks, including at least a first dice stack and a second dice stack, wherein the first dice stack is positioned at a first position on an interface die and wherein the second dice stack is positioned at a second position on the interface die; and
   a plurality of conductive paths electrically coupled to enable concurrent communication between the interface die and the first dice stack, and between the interface die and the second dice stack, wherein the interface die is configured to communicate with the first dice stack via a first subset of the plurality of conductive paths and to communicate with the second dice stack via a second subset of the plurality of conductive paths.

2. The apparatus of claim 1, wherein each die of the first dice stack and the second dice stack includes a plurality of memory partitions.

3. The apparatus of claim 1, wherein at least some conductive paths of the first set of conductive paths are interleaved and electrically coupled to components to enable communication of command and/or address signals to dice in the first dice stack, and at least some conductive paths of the second set of conductive paths are interleaved and electrically coupled to components to enable communication of command and/or address signals to dice in the second stack.

4. The apparatus of claim 2, wherein the interface die comprises a plurality of control circuits, and wherein each of the plurality of control circuits is configured to communicate with a vertical arrangement of at least some of the plurality of memory partitions via one or more communicating paths included in the plurality of conductive paths.

5. The apparatus of claim 4, wherein at least some of the communicating paths comprise through silicon vias.

6. An apparatus comprising:
   a plurality of dice stacks positioned on an interface die, wherein at least one dice stack includes:
      dice arranged in a stack, wherein the stack includes at least a first die, a second die, and an interface die; and
      a plurality of conductive paths including a first conductive path and a second conductive path, wherein the first conductive path passes through the second die and provides communication between a first circuit component of the first die and a first circuit component of the interface die, wherein the second conductive path passes through the first die and provides communication between a first circuit component of the second die and a second circuit component of the interface die, and wherein the first circuit component of the first die and the first circuit component of the second die include input/output (IO) circuits, and the first circuit component of the interface die and the second circuit component of the interface die include control circuits.

7. The apparatus of claim 6, further comprising:
   a third conductive path included in the plurality of conductive paths, wherein the third conductive path couples a second circuit component of the first die and a second circuit component of the second die to a third circuit component of the interface die.

8. The apparatus of claim 6, further comprising:
   a third conductive path included in the plurality of conductive paths, wherein the third conductive path couples a second circuit component of the first die to a third circuit component of the interface die; and
   a fourth conductive path included in the plurality of conductive paths, wherein the fourth conductive path couples a second circuit component of the second die to a fourth circuit component of the interface die.

9. The apparatus of claim 6, wherein the first circuit component of the first die is configured to communicate with the first circuit component of the interface die concurrently with the second circuit component of the second die communicating with the second circuit component of the interface die.

10. The apparatus of claim 6, wherein the dice stack includes a third die and a fourth die, and wherein the first conductive path passes through the fourth die and provides communication between a first circuit component of the third die, the first circuit component of the first die, and a first control circuit of the interface die, and wherein the second conductive path passes through the third die and provides communication between a first circuit component of the fourth die, the first circuit component of the second die, and the second control circuit of the interface die.

11. The apparatus of claim 6, wherein the dice stack includes a third die and a fourth die, and a third conductive path included in the plurality of conductive paths passes through the first die, second die and fourth die and couples a first circuit component of the third die to a third circuit component of the interface die, and a fourth conductive path included in the plurality of conductive paths passes through the first die, the second die and the third die and couples a first circuit component of the fourth die to a fourth circuit component of the interface die.

12. The apparatus of claim 7, wherein the second circuit component of the first die and the second circuit component of the second die include command circuits and/or addressing circuits, and the third circuit component of the control circuit includes a command circuit and/or an addressing circuit.

13. The apparatus of claim 8, wherein the first, second, third, and fourth conductive paths are interleaved.

14. The apparatus of claim 11, wherein the first, second, third and fourth conductive paths are interleaved to form a plurality of memory vaults of the interface die and the first, second, third and fourth dice.

15. The apparatus of claim 10, wherein the first conductive path, the first circuit component of the first die, the first circuit component of the third die and first control circuit form a first vault, and wherein the second conductive path, the first circuit component of the second die, the first circuit component of the fourth die and the second control circuit form a second vault.

16. The apparatus of claim 10, further comprising:
a plurality of vaults, wherein each vault includes alternating dice in the stack, and one or more control circuits of the interface die communicatively coupled to the alternating dice in the stack by at least one conductive path.

17. The apparatus of claim 11, wherein the first circuit component of the first die, the first circuit component of the second die, the first circuit component of the third die, and the first circuit component of the fourth die each include command and/or address circuits, and wherein the first, second, third, and fourth conductive paths are interleaved.

18. An apparatus comprising:
dice arranged in a plurality of stacks, wherein each stack is arranged to communicate with a common interface die, and wherein each stack includes at least a first die and a second die; and
a plurality of conductive paths, wherein a first conductive path included in the plurality of conductive paths passes through the second die and couples a first circuit component of the first die to the interface die, and a second conductive path included in the plurality of conductive paths passes through the first die and couples a first circuit component of the second die to the interface die, and wherein the first conductive path and the second conductive path interleave between the first die and the second die of each the plurality of stacks.

19. The apparatus of claim 18, further comprising:
a third conductive path included in the plurality of conductive paths and coupling the first die and the second die to the interface die.

20. The apparatus of claim 18, further comprising:
a third conductive path included in the plurality of conductive paths and passing through the second die to couple a command circuit and/or an addressing circuit of the interface die to a command circuit and/or an address circuit of the first die, and
a fourth conductive path included in the plurality of conductive paths and passing through the first die to couple the command circuit and/or an addressing circuit of the interface die to a command circuit and/or an address circuit of the second die.

21. The apparatus of claim 19, wherein the third conductive path couples a command circuit and/or an addressing circuit of the interface die to a command circuit and/or an address circuit of the first die and a command circuit and/or an address circuit of the second die.

22. An apparatus comprising:
dice arranged in a plurality of stacks, wherein each stack is arranged to communicate with a common interface die, and wherein each stack includes at least a first die and a second die;
a plurality of conductive paths, wherein a first conductive path included in the plurality of conductive paths passes through the second die and couples a first circuit component of the first die to the interface die, and a second conductive path included in the plurality of conductive paths passes through the first die and couples a first circuit component of the second die to the interface die; and
a third conductive path included in the plurality of conductive paths and coupling the first die and the second die to the interface die, wherein the first conductive path and the second conductive path interleave between the first die and the second die of each of the plurality of stacks, and the third conductive path is not interleaved.

23. The apparatus of claim 20, wherein the third conductive path and the fourth conductive path interleave between the first die and the second die of each of the plurality of stacks.

24. The apparatus of claim 23, wherein the third and fourth conductive paths enable concurrent command and/or address signaling to the first and second die of each of the plurality of stacks.

25. An apparatus comprising:
a first dice stack positioned at a first position on an interface die, wherein the dice stack includes at least a first die and a second die;
a first set of conductive paths, the first set of conductive paths including a first conductive path coupling a first circuit component of the first die to a first control circuit of the interface die, a second conductive path coupling a first circuit component of the second die to a second control circuit of the interface die, a third conductive path coupling an address circuit of the first die to a first addressing circuit of the interface die, and a fourth conductive path coupling an address circuit of the first die to a second addressing circuit of the interface die;
a second dice stack positioned at a second position on the interface die, wherein the second dice stack include a third die and a fourth die; and
a second set of conductive paths including a fifth conductive path and a sixth conductive path, wherein the fifth conductive path couples a first circuit component of the third die to a third control circuit of the interface die and the sixth conductive path couples a first circuit component of the fourth die to a fourth control circuit of the interface die.

26. The apparatus of claim 25, wherein the first conductive path passes through the second die, the second conductive path passes through the first die, the third conductive path passes through the second die, and the fourth conductive path passes through the first die.

27. The apparatus of claim 25, further comprising:
a seventh conductive path included in the second set of conductive paths to couple an address circuit of the third die and an address circuit of the fourth die to a third addressing circuit of the interface die.

28. The apparatus of claim 25, further comprising:
a seventh conductive path included in the second set of conductive paths to couple an address circuit of the third die with a third addressing circuit of the interface die, and
an eighth conductive path included in the second set of conductive paths to couple an address circuit of the fourth die with a fourth addressing circuit of the interface die.

29. A method comprising:
forming a plurality of dice stacks on an interface die, wherein forming at least one of the dice stacks includes:
positioning a first die on an interface die; and
arranging a second die in a stack with the first die to substantially align a first conductive path of the first die with a second conductive path of the second die, and to substantially align a second conductive path of the first die with a first conductive path of the second die, wherein arranging the second die includes rotating the second die about an axis before arranging the second die in the stack.

30. The method of claim 29, further comprising:
arranging a third die in the stack with the first die and the second die to substantially vertically align a first conductive path of the third die with the second conductive path of the second die and the first conductive path of the first die, and to substantially vertically align a second conductive path of the third die with the first conductive path of the second die and the second conductive path of the first die.

31. The method of claim 29, further comprising:
arranging a third die in the stack with the first die and the second die in alignment with the first die and second die and with an orientation similar to the first die.

32. The method of claim 31, further comprising:
arranging a fourth die in the stack with the first die, the second die, and the third die, wherein the first and third die have a first similar orientation, and the second and fourth die have a second similar orientation different from the first similar orientation of the first and third die.

33. A method comprising:
positioning a first dice stack at a first position on an interface die;
positioning a second dice stack at a second position on the interface die such that the interface die can be configured to enable concurrent communications with the first dice stack and the second dice stack;
positioning a third dice stack at a third position on the interface die; and
positioning a fourth dice stack at a fourth position on the interface die such that the interface die can be configured to enable concurrent communications with the first dice stack, the second dice stack, the third dice stack, and the fourth dice stack.

34. A method comprising:
conducting concurrent communications between a first die and a first control circuit of an interface die, and between a second die and a second control circuit of the interface die; and
conducting concurrent communication between a third die and a third control circuit of the interface die, and between a fourth die and a fourth control circuit of the interface die.

35. The method of claim 34, further comprising:
communicating with the first die and the second die using a common control circuit of the interface die.

36. The method of claim 34, further comprising:
conducting concurrent communication between the first, second, third, and fourth dice and the interface die.

37. The method of claim 34, further comprising:
conducting concurrent communication between the first and third dice and the interface die, and conducting communication between the second and fourth dice and the interface die.

38. The method of claim 37 wherein the concurrent communication between the first and third dice and the interface die occurs before or after the concurrent communication between the second and fourth dice and the interface die.

39. A method comprising:
using a processor, conducting a first set of communications to odd dice in a stack using a first conductive path; and
using the processor, conducting a second set of communications to even dice in the stack using a second conductive path, wherein the first and second conductive paths are interleaved between an odd die and an even die in the stack and coupled to the processor.

40. The method of claim 39, wherein the first set of communications and the second set of communications are conducted concurrently.

41. The method of claim 39, wherein the first set of communications is conducted before or after conducting the second set of communications.

42. The method of claim 39, wherein the first set and the second set of communications comprise address signals and/or command signals.

43. The method of claim 39, wherein the first set and the second set of communications comprise memory information.

\* \* \* \* \*